(12) United States Patent
Camek et al.

(10) Patent No.: US 11,656,194 B2
(45) Date of Patent: May 23, 2023

(54) TDR MEASURING APPARATUS FOR DETERMINING THE DIELECTRIC CONSTANT

(71) Applicant: Imko Micromodultechnik GmbH, Ettlingen (DE)

(72) Inventors: Timo Camek, Karlsruhe (DE); Gerd Gritsch, Schönau (DE); Stefan Rolf, Gärtringen (DE)

(73) Assignee: Imko Micromodultechnik GmbH, Ettlingen (DE)

( * ) Notice: Subject to any disclaimer, the term of this patent is extended or adjusted under 35 U.S.C. 154(b) by 198 days.

(21) Appl. No.: 17/054,002

(22) PCT Filed: Apr. 18, 2019

(86) PCT No.: PCT/EP2019/060094
§ 371 (c)(1),
(2) Date: Nov. 9, 2020

(87) PCT Pub. No.: WO2019/214924
PCT Pub. Date: Nov. 14, 2019

(65) Prior Publication Data
US 2021/0270761 A1    Sep. 2, 2021

(30) Foreign Application Priority Data
May 9, 2018 (DE) ..................... 10 2018 111 152.5

(51) Int. Cl.
*G01R 27/26* (2006.01)
*G01N 27/22* (2006.01)

(52) U.S. Cl.
CPC ......... *G01N 27/221* (2013.01); *G01N 27/223* (2013.01); *G01R 27/2676* (2013.01)

(58) Field of Classification Search
CPC .. G01R 27/06; G01R 27/2676; G01N 27/223; G01N 27/221
See application file for complete search history.

(56) References Cited

U.S. PATENT DOCUMENTS

| | | |
|---|---|---|
| 5,459,403 A | 10/1995 | Kohler et al. |
| 5,612,622 A | 3/1997 | Goldman et al. |

(Continued)

FOREIGN PATENT DOCUMENTS

| | | |
|---|---|---|
| EP | 0478815 A1 | 4/1992 |
| JP | 2012239690 A | 12/2012 |

*Primary Examiner* — Jeff W Natalini
(74) *Attorney, Agent, or Firm* — Mark A. Logan; Endress+Hauser (USA) Holding, Inc.

(57) ABSTRACT

Disclosed is a TDR measuring apparatus for determining the dielectric constant and material properties derived therefrom of a medium flowing through a pipeline. The apparatus includes signal generation electronics which generate TDR measurement signals, transmitting and receiving electronics, a coupling-in/coupling-out apparatus which couples the TDR measurement signals into and out of an electrically conductive measuring probe of a predefined length, and control/evaluation electronics which use the propagation time of the TDR measurement signals to determine the dielectric constant. The measuring probe is arranged in an electrically insulated manner outside of the pipeline. Alternately, the measuring probe is placed in the pipeline such that the outer surface of the measuring probe facing the medium terminates flush with the inner surface of the pipeline and is configured such that the propagation time and the amplitude of the measurement signals on the measuring probe are dependent on the dielectric constant of the medium.

13 Claims, 3 Drawing Sheets

(56) References Cited

U.S. PATENT DOCUMENTS

| | | | |
|---|---|---|---|
| 2002/0186025 A1* | 12/2002 | Neven | G01F 23/284 |
| | | | 324/642 |
| 2003/0011386 A1 | 1/2003 | Xie et al. | |
| 2003/0184317 A1* | 10/2003 | Yamagishi | C12M 41/48 |
| | | | 324/663 |
| 2013/0033272 A1 | 2/2013 | Folgeroe et al. | |
| 2014/0345740 A1 | 11/2014 | Demanze | |
| 2016/0313259 A1 | 10/2016 | Shayovitz | |
| 2017/0350843 A1* | 12/2017 | Mohr | G01N 33/2823 |
| 2018/0128664 A1* | 5/2018 | Momose | G01F 1/584 |
| 2018/0340879 A1* | 11/2018 | Boverman | G01N 15/1031 |

\* cited by examiner

TDR MEASURING APPARATUS FOR DETERMINING THE DIELECTRIC CONSTANT

CROSS-REFERENCE TO RELATED APPLICATIONS

The present application is related to and claims the priority benefit of German Patent Application No. 10 2018 111 152.5, filed on May 9, 2018 and International Patent Application No. PCT/EP2019/060094, filed on Apr. 18, 2019, the entire contents of which are incorporated herein by reference.

TECHNICAL FIELD

The invention relates to a TDR measuring device for determining the dielectric constants and/or material properties derived therefrom, in particular the moisture and/or the conductivity, of a medium which is passed through a pipeline. It goes without saying that the pipeline can be any line that is suitable for carrying a medium. It can therefore be a closed line or a channel-shaped line.

BACKGROUND

The dielectric TDR measuring principle for determining the moisture of a medium is used in many industrial applications. The dielectric constant (DC) of a material is measured via an electromagnetic radio frequency field, the electromagnetic radio frequency field penetrating the material to be measured. The dielectric constant of water has a value of 80 at 20° C. and thus differs greatly from the dielectric constants of solids which, depending on the material, have DC values of 3 to 30. With this strong dielectric contrast, the dielectric constant can thus be used as a parameter for the water content or the material moisture.

The TDR measuring principle used for DC measurement (time domain reflectometry, also called cable radar) has become increasingly popular in the last 20 years as a precise measuring method for demanding applications in the industry. In the case of corresponding TDR measurements, usually two- or three-wire, parallel waveguides are used. The waveguide arrangement corresponds to the actual sensor or the measuring probe. This is introduced into the medium to be examined in the form of rods or plates.

For the DC measurement, a voltage jump or a signal edge is preferably generated, which propagates along a coaxial cable which is connected to the waveguides. If the voltage jump is applied to the waveguide, partial reflection occurs. The further propagating portion of the measurement signal is completely reflected at the probe end. The step response of a waveguide can be measured over the time domain, whereby the reflection time represents the measure of the water content or the complete dielectric properties.

The basis for the application of TDR technology for moisture measurement is the following physical relationship:

$$c = \frac{c_0}{\sqrt{\varepsilon_r \cdot \mu_r}}$$

Accordingly, the propagation speed c of an electromagnetic wave in the vacuum is equal to the speed of light $c_0$. Outside the vacuum, the propagation speed c depends only on the dielectric constant $\varepsilon_r$ and the magnetic permeability $\mu_r$ of the material in which the wave propagates. The latter can be set equal to 1 in non-magnetic materials, so that the propagation speed depends only on the dielectric constant (DK).

The challenge with TDR measurement lies in the very short propagation time of the electromagnetic wave on the probe. Therefore, short-term and steep-edged pulses (rise time <300 picoseconds) must be used for the measurement.

A method as well as a device for determining the humidity of a product/medium using a TDR method are known from EP 0 478 815 A1. In the known method, a rectangular signal is applied to a measurement line by means of a measurement signal transmitter. The pulse duration of the signal is in this case selected to be twice as large as the transit time of the signal on the measurement line. The signal is reflected by the measurement line, i.e., at the end of the measurement line. The sum signal is thus formed at the input of the measurement line or at the output of the measurement signal transmitter by superimposing the amplitudes of the measurement signal fed into the measurement line and of the measurement signal reflected by or at the end of the measurement line. The measurement line is preferably designed as a probe.

In the TDR method, it must be ensured that an electrical pulse can propagate along the measurement line/probe and be reflected at the end of the measurement line/probe. The moisture of the medium is determined from the transit time of the pulse. In the known solution, the pulse, triggered by the signal processing electronic, runs through a cable to the first measurement line, from the end of the first measurement line to the beginning of the second measurement line, is reflected at the end of the second measurement line and runs back to the signal processing electronic. The transit time of the pulse is used to calculate the moisture value and is output via standard analog signals which are based, for example, on the 0-20 mA or the 4-20 mA standard. However, the moisture can also be output in parallel via a digital interface, such as an RS 485.

The applicant develops and markets diverse measuring devices based on the TDR measuring principle. In particular, measuring devices are offered under the names Sono-Vario, Sono-Silo, Trime-Pico. The measuring devices each consist of the sensor or the measuring probe and TDR measuring electronics, which are each accommodated on a circuit board in the probe housing or outside the probe housing. The TDR measuring electronics are always connected (internally in the probe housing, or externally) to the sensor or the measuring probe via a radio frequency cable/coaxial cable.

The different probe designs are optimally designed for different industrial applications. In particular, sensors are offered which vary in length, in particular between 0.05 m and 0.5 m. The known solutions are realized primarily via rod arrangements or also via planar sensors; these are either coated or uncoated.

SUMMARY

The aim of the invention is to provide a TDR measuring device which measures parameters of the medium flowing through a pipeline non-invasively and/or detects a change in state of the pipeline. The term "non-invasive" in connection with the invention is understood to mean that the flow of the medium through the measuring device is not hindered or disturbed.

The invention is achieved by a TDR measuring device for determining the dielectric constant and material properties derived therefrom, in particular the moisture and/or the conductivity, of a medium flowing through a pipeline. According to a further development of the invention, the solution according to the invention is moreover suitable for detecting a change in state of the pipeline through which the medium flows, or for detecting the nature of a medium passing through the pipeline.

The TDR measuring device comprises a signal generation electronics which generates TDR measuring signals, preferably jump signals, as described in EP 0 478 815 A1, a transmission and/or reception electronics which transmits and/or receives the TDR measuring signals, a coupling/decoupling device which couples the TDR measuring signals to an electrically conductive measuring probe of a predetermined length or decouples them from the measuring probe and a control/evaluation electronics which, on the basis of the transit time of the TDR measuring signals, determines the dielectric constant and the material properties derived therefrom, in particular the moisture and/or conductivity, of the medium. The electronics are preferably connected to the sensor via an RF cable. The electronics are either arranged on the sensor or are arranged spatially separated from the sensor, the distance usually being between 1-2 m.

Preferably, the measuring probe is arranged electrically insulated in the direction of the interior of the pipeline through which the medium flows, and is designed such that the propagation time of the measuring signals on the measuring probe depends on the dielectric constant of the medium passing through the pipeline. Alternatively, the measuring probe is arranged such that it is flush with the inner surface of the pipeline facing the flowable medium. It goes without saying that in this case at least two electrodes carrying the measuring signals must be provided, which are electrically insulated from one another. This alternative positioning of the measuring probe is particularly useful if concentration measurements are to be made on flowable media with very high dielectric constants, e.g. sugar solutions for soft drinks. In these applications, isolation of the measuring probe from the flowable medium would lead to significantly reduced measurement accuracy. The dielectric constants of corresponding media are above 50, frequently between 60-80. If the conductivity of the medium is more than 25 ms/cm, the measurement signal is attenuated by electrical short-circuiting to such an extent that it can no longer be received, depending on the probe geometry. Incidentally, the frequency used for the measurement signals is preferably in the range of 500 MHz-2 GHz.

The media that may be used may be liquid or viscous. However, the medium can also be a bulk material or a powdery substance.

The TDR measuring device according to the invention enables the non-invasive inline measurement of various physical properties of liquid/viscous media or bulk materials while passing through a pipeline. Since the measuring probe is arranged in the direction of the flow path of the medium, the medium can flow unimpeded and unaffected by the measuring probe through the pipeline. Furthermore, the TDR measuring device makes it possible to detect changes in the wall of the pipeline through which the medium flows. This information can subsequently be used for compensation purposes or for fault condition detection. A change in state in the region of the pipeline can be triggered, for example, by fouling.

The TDR measuring device is used for non-invasive determination of the dielectric constant, permittivity and/or conductivity of the medium flowing through the pipeline. In particular, the TDR measuring device according to the invention allows improved accuracy in the determination of the moisture or conductivity.

According to an advantageous embodiment of the TDR measuring device according to the invention, the measuring probe consists of at least two electrodes, preferably designed as conductor tracks, with a first electrode carrying the TDR measurement signals and with the at least one further electrode being designed as a guard or ground electrode. Sensors for recording measured values using TDR technology preferably consist of one or two electrically conductive electrodes at ground potential and an electrically conductive electrode into which the high-frequency measurement signal is coupled. The electrodes are guided in parallel and each electrically contacted at an end region. The high-frequency signal is reflected at the "open", non-electrically contacted end. The measuring probe is connected via a coaxial cable to a TDR measuring electronics (which is usually arranged on a circuit board). The TDR measuring electronics generates the radio frequency signal, measures the propagation time of the signal reflected at the probe end, evaluates the measured data and provides the measurement result. Depending on the application, the circuit board can be integrated directly in a sensor housing. However, depending on the particular application, it is possible to arrange the circuit board remote from the sensor housing.

It is to be regarded as essential in the invention that the dimensioning and/or the design of the measuring probe are/is designed such that the electromagnetic field generated by the measuring signals penetrates the interior of the pipeline at least approximately completely. The field geometry can be specifically influenced by the arrangement and configuration of the at least one grounded electrode. In this way, a first advantageous embodiment of the measuring probe provides that the first electrode and the guard or ground electrode are arranged essentially on or in mutually opposite surface regions of the pipeline.

Incidentally, the measuring probe preferably consists of three electrodes designed as conductor tracks, one of the electrodes carrying the TDR measuring signals and being arranged essentially centrally with respect to the two electrodes designed as guard or ground electrodes.

An embodiment provides—as already described—that there is no direct contact between the electrodes and the medium. Here, the electrodes are arranged either on the outer wall of the pipeline or in the pipe wall of the pipeline. It goes without saying that the pipeline itself is made of an electrically non-conductive material, at least in the region, in which the measuring probe is located. It is also possible to configure the corresponding pipeline section with the electrodes as a separate unit, wherein the separate unit is inserted into the pipeline. Here, the pipeline and the separate unit preferably have the same inner pipe diameter. In a further, previously mentioned embodiment, the electrodes are placed with respect to the inner surface of the pipeline in such a way that their outer surface facing the medium is flush with the inner surface of the pipeline facing the medium.

In order to develop a further development of the measuring probe, the electrodes are arranged essentially parallel to one another and spirally with respect to the pipeline. An alternative embodiment provides that the electrodes are arranged parallel to one another in the form of partial circles (see FIG. 4), essentially perpendicular to the direction of flow of the flowing medium through the pipeline. In the selected embodiments, it must be ensured that the interior of the pipeline in the region of the measuring probe is completely or at least partially penetrated by the electromagnetic field of the measuring signals running along the measuring probe. In the two first-mentioned embodiments, the degrees of freedom with respect to the length of the electrodes are the same as in the latter arrangement of the electrodes.

Furthermore, it is provided that the electrodes preferably have the same length, but differ in width. With the aforementioned different embodiments of the electrodes, the measuring probe can be optimally adapted to the respective application within wide limits. If the electrodes lie opposite one another, the penetration of the interior with the electromagnetic field of the measuring signals running along the measuring probe over the cross section of the pipeline is guaranteed.

Furthermore, it is proposed to configure the TDR measuring device in such a way that, in addition to determining the dielectric constant of the medium passing through the pipeline, it also provides information about a change in state of the wall of the pipeline. While the first measuring probe is designed such that the electromagnetic field generated by the measuring signals, i.e. the measuring field, penetrates the interior of the pipeline at least approximately completely, the second measuring probe is designed such that the electromagnetic field generated by the measuring signals passes through only a partial region of the interior of the pipeline in the vicinity of the pipeline wall. While in the first measuring probe the propagation time and/or the attenuation of the measuring signals running along the measuring probe provides information about the dielectric constant of the medium, the propagation time and/or the attenuation of the measuring signals in the second measuring probe provides information about a change in state of the pipeline. This makes it possible to detect abrasion occurring at the inner wall of the pipeline as well as deposits/adhesions of the medium to the inner wall of the pipeline. Both measuring probes are preferably arranged axially offset from one another on the pipeline. The two measurements can be carried out alternately by means of a switch or parallel to one another.

One embodiment of the TDR measuring device according to the invention provides a multi-sensor arrangement comprising, for example, three measuring probes preferably offset axially relative to one another and configured differently. While a first measuring probe is designed such that the electromagnetic field generated by the measuring signals at least approximately completely penetrates the interior of the pipeline, a second measuring probe and a third measuring probe are designed such that the electromagnetic fields generated by them in the interior of the pipeline from the measuring signals pass through annular regions of different thickness in the region of the wall of the pipeline. Such an embodiment of the TDR measuring device makes it possible, for example, to detect whether the medium flows through the pipeline in a laminar manner. Furthermore, with such a TDR measuring device it can also be detected whether a homogeneous mixing is given in the case of a multi-component medium flowing through the pipeline, or whether the medium which is passed through the pipeline has split into its different components, e.g. oil and water.

Furthermore, it is considered advantageous in connection with the invention if the measuring probe is arranged in a housing acting as a Faraday cage.

A very interesting embodiment of the TDR measuring device according to the invention proposes that the signal generation electronics, the transmitting and/or receiving electronics, the coupling/decoupling device and the measuring probe are arranged on a multilayer, preferably a three-layer, circuit board. In particular, in this embodiment, a bore is provided in the circuit board, which is dimensioned such that the pipeline can be arranged approximately flush in the bore. In this embodiment of the measuring probe, it is also suggested that the electrodes are arranged in the layer structure of the circuit board and relative to the bore in the circuit board in such a way that the measurement signals carried in the first electrode interact with the medium flowing in the pipeline.

Furthermore, it is provided that the pipeline is a flexible or rigid hose or a measuring capillary which, at least in the region of the passage through the bore, consists of a non-conductive material.

The solution according to the invention in the different embodiments is distinguished by the following advantages:

The measuring probes according to the invention can be miniaturized with suitable production methods. As a result, the measuring probes or sensors are best suited for integration into other components, for example plugs/couplings or housings. The measuring probes according to the invention can also be integrated into a circuit board.

The measuring probe according to the invention operates in a contactless manner—in this case, the electrodes therefore have no direct contact with the medium. The electrodes are thus protected against environmental influences and against the medium. Abrasion does not occur. Both in the non-contact and non-invasive embodiments of the solution according to the invention, the electrodes can be integrated into the wall of the measuring probe—or in an alternative embodiment—into the circuit board itself. For example, the IMKS method (integrated metal/plastic injection molding) is used here.

The measuring probe can surround the pipeline in which the medium flows. Contactless or non-invasive measuring probes also have the advantage that they do not influence the flow path of the medium. Pressure losses in the pipeline or turbulence of the medium therefore do not occur. No special attention must also be paid to the respective installation position in the pipeline. Spacing requirements with respect to inlet or outlet paths are eliminated. The measuring probes according to the invention can also be installed in pipe bends. Moreover, the measuring probe can have different geometries or cross sections. For example, the cross section may be round, angular or oval.

BRIEF DESCRIPTION OF THE DRAWINGS

The invention is explained in more detail with reference to the following figures. These show.

DETAILED DESCRIPTION

Figure 1:
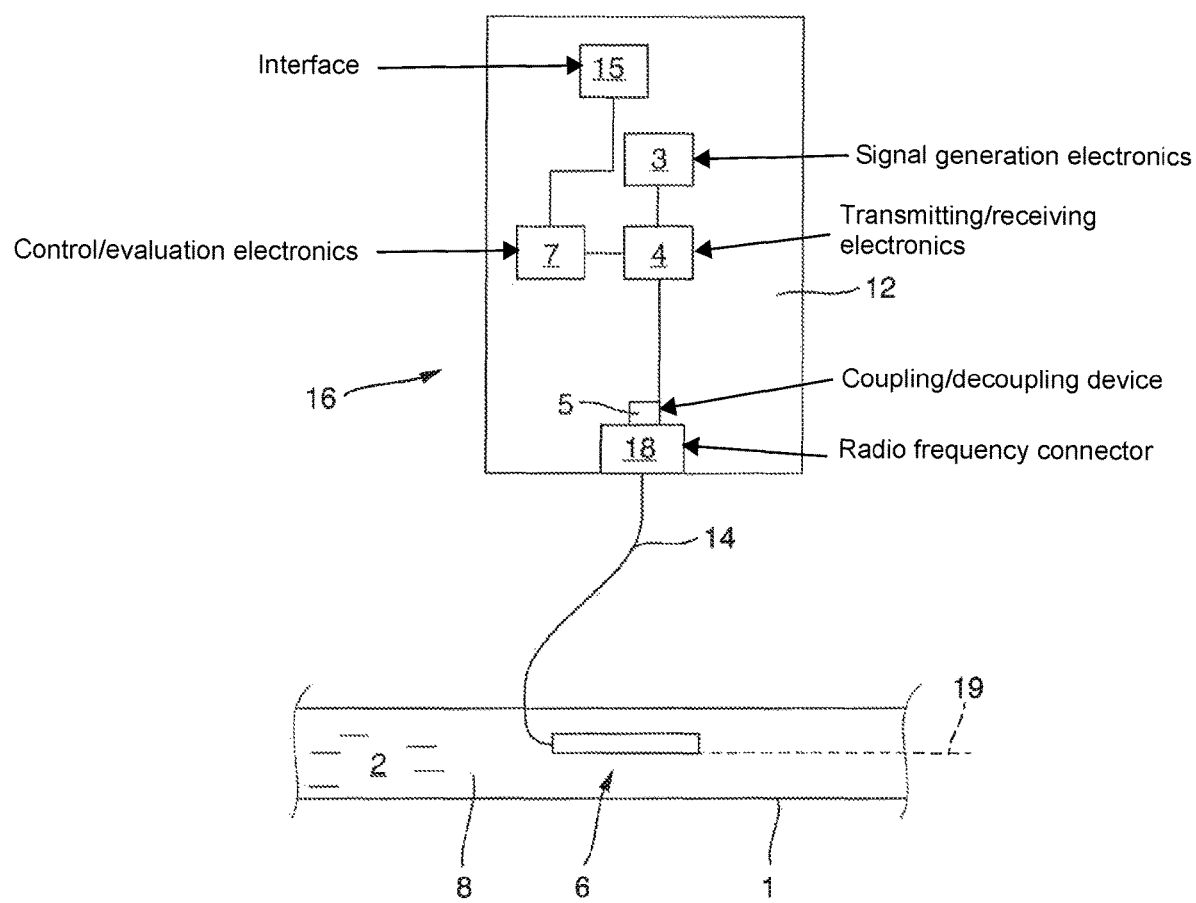
FIG. 1 shows a schematic illustration of a first embodiment of the TDR measuring device according to the present disclosure.

FIG. 1 shows a schematic representation of a first embodiment of the TDR measuring device according to the invention for the contactless or non-invasive determination of at least the dielectric constants and optionally derived properties of the medium of a medium 2 passing through a pipeline 1 and/or for detecting a change in state of the pipeline 1 through which the medium 2 flows. The TDR measuring device consists of a sensor or a measuring probe 6 and a measuring electronics 16. In the case shown, the two components 6, 16 are spaced apart from one another and connected to one another by the measuring line 14. The measuring line 14 is preferably a coaxial cable.

The electronic components of the measuring electronics 16 are arranged on the circuit board 12: the signal generation electronics 3, the transmitting and/or receiving electronics 4, the coupling/decoupling device 5, and the control/evaluation electronics 7. The signal generation electronics 3 generate the TDR measuring signals, the transmitting and/or receiving electronics 4 emit the TDR measuring signals and/or receive the TDR measuring signals reflected on the measuring probe. The coupling and decoupling of the TDR measurement signals to the measuring line 14 and the measuring probe 6 takes place via the coupling/decoupling device 5. From here, the measurement signals are transmitted to the measuring probe 6 via a radio frequency plug connector 18, to which a radio frequency cable 14 is connected. Based on the propagation time of the TDR measurement signals on the measuring probe 6, the control/evaluation electronics determine at least the dielectric constant and/or the permittivity and possibly characteristics or parameters of the medium derived therefrom. These medium properties are in particular the moisture and/or the conductivity. Furthermore, the TDR measuring device according to the invention is suitable for alternatively or additively detecting a change in state of the pipeline 1. The change in state is caused, for example, by deposits on the inner wall of the pipeline 1. The measurement data or the data about a change in state of the pipeline 1 are forwarded via the interface 15 to a superordinate control/display device. Forwarding can be wired or wireless.

Preferred embodiments of the sensor or of the measuring probe 6 are described in more detail in FIGS. 2-5.

The sensors or measuring probes 6 according to the invention differ from the previously known sensors in that they are connected to the pipeline 1, in which the medium to be examined is guided, specifically in such a way that they are isolated from the medium. The measuring probes 6 can be mounted on the outer wall of the pipeline 6, but can also be integrated into the wall of the pipeline 1. Furthermore, the measuring probes 6 can be placed in such a way that the surface of the electrodes 9, 10, 11 pointing into the interior of the pipeline 6 is flush with the inner surface of the pipeline 6. Advantageously, a pipeline section and the electrodes 9, 10, 11 can preferably be produced in one method step using the IMKS method (integrated metal/plastic injection molding). The corresponding component can then subsequently be introduced into the pipeline via a suitable attachment. Alternatively, the electrodes 9, 10, 11 can also be applied to the outer surface of an existing pipeline 1.

Figure 2:
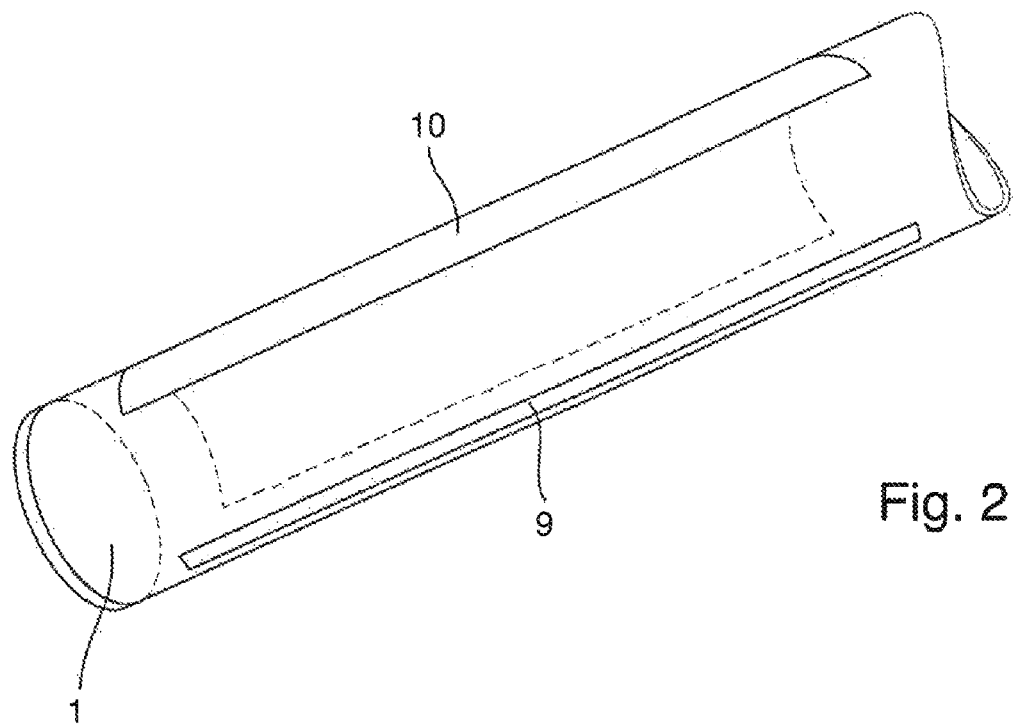
FIG. 2 shows a first embodiment of the TDR measuring probe.

FIG. 2 shows a first embodiment of the TDR measuring probe 6. In the embodiment shown, the sensor has two electrodes 9, 10, which are arranged on or in the pipeline 1 in the direction of the longitudinal axis 19 of the pipeline 1. The pipeline 1—generally also referred to as a measuring body in connection with the invention—must be an electrical insulator (e.g. plastic/ceramic) since otherwise the measuring field cannot propagate in the pipeline 1 and consequently cannot be influenced by the medium 2. The electrodes 9, 10 advantageously have the same length L, but different widths B. By varying the width B and/or the length L of the electrodes 9, 10, the measuring field can be optimally adapted to the respective measuring task.

Figure 3:
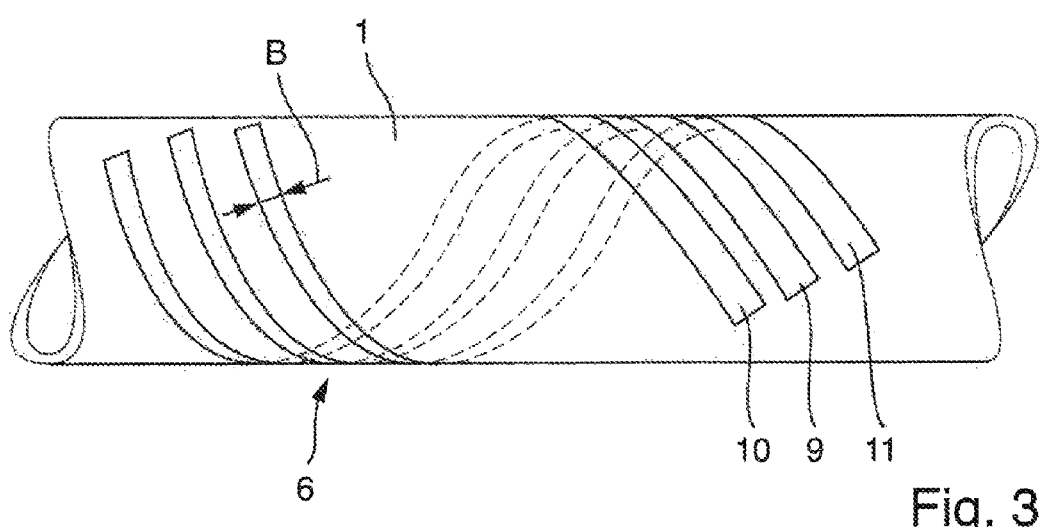
FIG. 3 shows a second embodiment of the TDR measuring probe.

FIG. 3 shows a second embodiment of the TDR measuring probe 6, which is referred to as a spiral sensor or axial spiral. In the embodiment shown, three electrodes 9, 10, 11 are mounted along the longitudinal axis 19 of the pipeline 1 or of the measuring body. In turn, the measuring body 1 must be made of an electrically insulating material (e.g. plastic/ceramic) at least in the region of the measuring probe, since otherwise the measuring field cannot propagate in the interior 8 of the pipeline 1 or of the measuring body and cannot interact with the medium 2 to be measured. The length L of the electrodes 9, 10, 11 substantially determines the sensitivity of the sensor 6, since the propagation time of the measurement signals to the electrode end and back extends with longer electrodes 9, 10, 11. In the spiral sensor shown, there are many options with regard to the length L, but also the width B.

In the case of the spiral sensor, the electrodes 9, 10, 11 are wound in parallel in spiral form around the pipeline 1 or the measuring body. The electrodes 9, 10, 11 are advantageously of the same length, but can also be of different widths in this design. With the width and length of the electrodes 10, 11, 12 and with the pitch of the spiral, the measuring field can advantageously be tuned to the respective measuring task.

Figure 4:
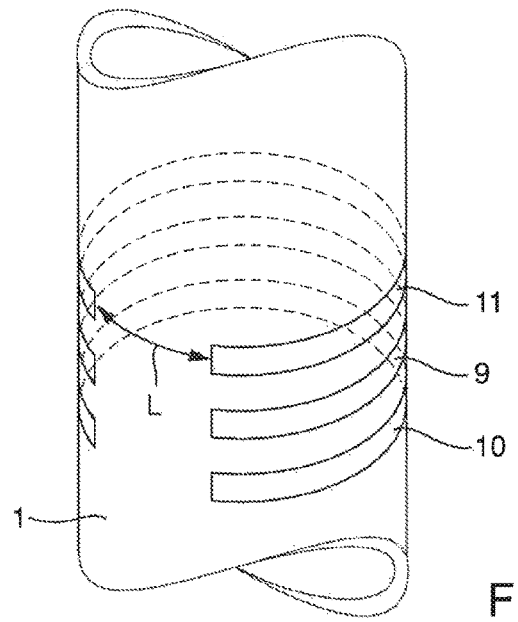
FIG. 4 shows a third embodiment of the TDR measuring probe and FIG. 5 shows a schematic representation of a second embodiment of the TDR measuring device according to the present disclosure.

A third embodiment of the TDR measuring probe 6 can be seen in FIG. 4. In this sensor 6, referred to as a concentric sensor 6 or as a partial circular conductor, three electrodes 9, 10, 11 are arranged concentrically to the longitudinal axis 19 on or in the pipeline 1, but the circles are not closed. Here, too, the pipeline 1 or the pipeline section with the measuring probe 6 must again be an electrical insulator (e.g. plastic/ceramic), since otherwise the measuring field cannot propagate into the interior 8 of the measuring body 1 and cannot interact with the medium to be measured. The electrodes 9, 10, 11 are advantageously of the same length, the width may be the same or different. By varying the width and/or length of the electrodes 9, 10, 11, the measuring field can be advantageously dimensioned for the respective measuring task.

Figure 5:
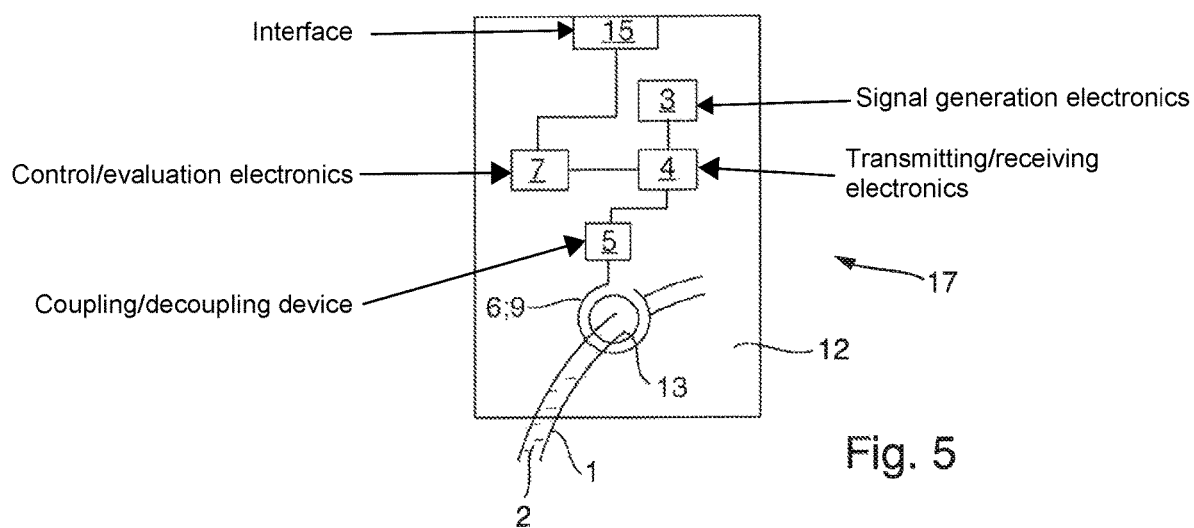

FIG. 5 shows a schematic representation of a second embodiment of the TDR measuring device 17 according to the invention, which can be referred to as a PCB onboard solution. A description of the individual electronic components 3, 4, 5, 7 of the measuring electronics 16 is dispensed with since, except for one exception, they are identical to the components shown in FIG. 1.

The measuring probe 6 or the sensor preferably corresponds to the partial circular conductor shown in FIG. 4. In this embodiment, however, the measuring probe 6 consisting of partial circles is not arranged concentrically on or in the pipeline 1, in which the medium 2 to be measured is guided, but concentrically in a bore 13 provided in the circuit board 12. The pipeline 1 is guided through this bore 13.

The bore 13 is preferably located in the vicinity of the radio frequency connection or the coupling/decoupling electronics. The preferably three partially circular electrodes 9, 10, 11 arranged concentrically around the bore 13 are arranged in three layers of the circuit board 12. The radio frequency plug connector 18 and the coaxial cable 14 shown in FIG. 1 are omitted in the embodiment of the TDR measuring device 17 according to the invention shown in FIG. 5. Located in the central region of the semicircular conductor path sensors 9, 10, 11 is the bore 13, through which, for example, a measuring capillary 1 or a tube is guided, in which the liquid medium 2 to be measured flows. The measuring body 1 is made of an electrically non-conductive material at least in the region of the passage through the bore 13 of the circuit board 12.

The invention claimed is:

1. A Time Domain Reflectometry (TDR) measuring device for a determination of at least a dielectric constant of a medium flowing through a pipeline, the TDR measuring device comprising:
    signal generation electronics configured to generate TDR measurement signals;
    transmission and reception electronics configured to transmit and to receive the TDR measurement signals;
    an electrically conductive measurement probe having a predetermined length;
    a coupling/decoupling device embodied to couple the TDR measurement signals to the measurement probe and to decouple the TDR measurement signals from the measuring probe; and
    a control/evaluation electronics configured to determine the dielectric constant and material properties derived therefrom, including a moisture content and a conductivity of the medium, based on a propagation time and a damping of the TDR measuring signals on the measuring probe,
    wherein the measuring probe is arranged non-invasively outside an interior of the pipeline, and
    wherein the measuring probe is configured such that the propagation time of the measuring signals on the measuring probe is dependent on the dielectric constant of the medium flowing through the pipeline.

2. The TDR measuring device according to claim 1,
    wherein the measuring probe includes two electrodes, wherein a first electrode of the two electrodes carries the TDR measuring signals, and wherein a second electrode of the two electrodes is configured as a guard or ground electrode.

3. The TDR measuring device according to claim 2,
    wherein the first electrode and the guard or ground electrode are arranged on or in mutually opposite surface regions of the pipeline.

4. The TDR measuring device according to claim 2,
    wherein the measuring probe includes a third electrode, wherein the first electrode carries the TDR measuring signals and is arranged centrally with respect to the second and third electrodes designed as guard electrodes or ground electrodes.

5. The TDR measuring device according to claim 4,
    wherein the electrodes are arranged parallel to one another and spirally with respect to the pipeline.

6. The TDR measuring device according to claim 4,
    wherein the electrodes are arranged parallel to one another in the form of partial circles perpendicular to a direction of flow of the flowing medium through the pipeline.

7. The TDR measuring device according to claim 4,
    wherein the electrodes have a same length, but differ in width.

8. The TDR measuring device according to claim 2,
    wherein the electrodes are arranged on an outer surface of a wall of the pipeline or are integrated into the wall of the pipeline.

9. The TDR measuring device according to claim 2,
    wherein at least two measuring probes are arranged offset to each other in a flow direction of the medium, wherein one measuring probe is designed such that it determines the dielectric constant of the medium and wherein the second measuring probe is designed such that it detects a change of state of the wall of the pipeline that is caused by abrasion of the wall of the pipeline or deposits on the inside of the wall of the pipeline facing the medium.

10. The TDR measuring device according to claim 2,
    wherein the signal generation electronics, the transmitting and/or receiving electronics, the coupling/decoupling device, and the measuring probe are arranged on a multilayer circuit board.

11. The TDR measuring device according to claim 10,
    wherein a bore is provided in the circuit board, and the bore is dimensioned such that the pipeline can be arranged flush in the bore.

12. The TDR measuring device according to claim 11,
    wherein the electrodes are arranged in the layer structure of the circuit board and relative to the bore in the circuit board such that the measurement signals guided in the first electrode interact with the medium flowing in the pipeline and/or are influenced by a change of state occurring in the pipeline.

13. The TDR measuring device according to claim 11,
    wherein the pipeline is a hose or a measuring capillary which, at least in the region of the passage through the bore, is embodied of a non-conductive material.

* * * * *